United States Patent [19]

Hamada et al.

[11] Patent Number: 5,368,675
[45] Date of Patent: Nov. 29, 1994

[54] METHOD FOR THE PREPARATION OF A FRAME-SUPPORTED PELLICLE FOR PHOTOLITHOGRAPHY

[75] Inventors: Yuichi Hamada; Yoshihiko Nagata; Meguru Kashida; Yoshihiro Kubota, all of Gunma, Japan

[73] Assignee: Shin-Etsu Chemical Co., Ltd., Tokyo, Japan

[21] Appl. No.: 103,928

[22] Filed: Aug. 6, 1993

[30] Foreign Application Priority Data

Aug. 21, 1992 [JP] Japan .................. 4-245828

[51] Int. Cl.$^5$ .................. B32B 27/00; B32B 7/00; G03F 9/00
[52] U.S. Cl. .................. 156/344; 156/584; 427/164; 427/372.2; 427/335; 427/389.7; 427/409; 427/385.5
[58] Field of Search ............... 427/164, 335, 372.2, 427/385.5, 389.7, 407.1, 409; 156/344, 584; 158/60

[56] References Cited

U.S. PATENT DOCUMENTS

| | | | |
|---|---|---|---|
| 2,570,273 | 10/1951 | Pryor | 156/108 |
| 4,378,953 | 4/1983 | Winn | 350/171 X |
| 4,536,240 | 8/1985 | Winn | 156/74 |
| 4,737,387 | 4/1988 | Yen | 156/60 X |
| 4,861,402 | 8/1989 | Gordon | 156/108 |
| 4,878,973 | 11/1989 | Ohtake | 156/85 X |
| 4,898,058 | 2/1990 | Seifert | 83/470 X |
| 4,944,962 | 7/1990 | Furada | 427/335 X |
| 4,966,813 | 10/1990 | Agou | 428/421 X |
| 5,059,451 | 10/1991 | Agou | 427/164 |
| 5,085,889 | 2/1992 | Nakagawa | 428/14 X |
| 5,229,229 | 7/1993 | Sato | 430/5 X |
| 5,246,767 | 9/1993 | Agou | 428/212 X |
| 5,254,419 | 10/1993 | Kashida | 430/5 |
| 5,286,567 | 2/1994 | Kubota | 428/422 X |

FOREIGN PATENT DOCUMENTS

| | | | |
|---|---|---|---|
| 0139185 | 12/1979 | Germany | 156/344 |
| 0210687 | 10/1985 | Japan | 156/344 |
| 0011671 | 3/1987 | Japan | 156/344 |
| 3199784 | 8/1988 | Japan | 156/344 |
| 1326429 | 7/1987 | U.S.S.R. | 156/344 |

Primary Examiner—David A. Simmons
Assistant Examiner—Charles Rainwater
Attorney, Agent, or Firm—McAulay Fisher Nissen Goldberg & Kiel

[57] ABSTRACT

An improvement is proposed in the method for the preparation of a frame-supported pellicle involving a step in which a resin film for the pellicle membrane formed on the surface of a substrate plate by the solution casting method is adhesively bonded to a rigid pellicle frame and then the substrate plate is removed by separating from the resin film by pulling the substrate and the frame apart in a gaseous atmosphere of which the relative humidity is 80% or higher in contrast to the conventional procedures in which this step is conducted either in water or in a gaseous atmosphere of an air-conditioned clean room having a relative humidity never exceeding 60%. By virtue of this unique procedure, an outstandingly small number of dust particles are deposited on the pellicle membrane obtained by the removal of the substrate therefrom along with an advantage of very smooth and easy removal of the substrate not to cause slack or rupture of the membrane.

4 Claims, No Drawings

METHOD FOR THE PREPARATION OF A FRAME-SUPPORTED PELLICLE FOR PHOTOLITHOGRAPHY

BACKGROUND OF THE INVENTION

The present invention relates to a method for the preparation of a frame-supported pellicle for dust-proof protection of a photomask used in the photolithographic patterning work in the manufacturing process of various kinds of electronic devices such as LSIs, VLSIs, liquid-crystal display units and the like. More particularly, the invention relates to a method for the preparation of a frame-supported pellicle which is outstandingly free from the troubles due to dust particle deposition thereon.

As is well known, the so-called photolithographic patterning work is widely undertaken in the manufacture of various kinds of electronic devices such as LSIs, VLSIs, liquid-crystal display units and the like, in which a photoresist layer formed on the surface of a substrate such as semiconductor silicon wafers and base plates of liquid-crystal display units is exposed patternwise to actinic rays such as ultraviolet light through a so-called photomask which is a transparency bearing the fine pattern to be formed in the photoresist layer. The pattern on the photomask is so fine that any dust particles deposited on the photomask greatly affect the quality of pattern reproduction resulting in a decrease in the yield of acceptable products.

It is a usual practice accordingly that the photolithographic patterning work is conducted in a clean room freed from dust particles floating in the air as completely as possible but perfect cleanness of photomasks can hardly be obtained even in a clean room of the highest degree of cleanness. Therefore, a conventional means to ensure cleanness of a photomask is to protect the photomask by mounting a frame-supported pellicle thereon, which consists of a rigid frame to be mounted on and fixed to the photomask by means of a pressure-sensitive adhesive and a highly transparent pellicle membrane of a plastic resin adhesively bonded to the frame in a slack-free fashion so that dust particles are never deposited on the surface of the photomask but are deposited on the pellicle membrane. The dust particles deposited on the pellicle membrane have little adverse influences on the quality of pattern reproduction since the light for pattern-wise exposure is focused on the photomask and not on the pellicle membrane at a distance from the photomask.

Needless to say, a primary requirement for the pellicle membranes is that transmission of light for the pattern-wise exposure therethrough is as high as possible. In this regard, several polymeric materials such as nitrocellulose, cellulose acetate and the like are widely used as a material of pellicle membranes. In connection with the method for adhesive bonding of the membrane to the frame, Japanese Patent Kokai No. 58-219023 proposes that a pellicle membrane made from these polymeric materials is attached and bonded to the surface of a pellicle frame, which is made from aluminum, stainless steel, polyethylene and the like, wet with an organic solvent capable of dissolving the polymer of the membrane. Alternatively, the pellicle membrane can be adhesively bonded to the surface of a pellicle frame by using an acrylic or epoxy resin-based adhesive (see, for example, U.S. Pat. No. 4,861,402 and Japanese Pat. Publication No. 63-27707). Besides the above mentioned cellulose derivatives as a material of the pellicle membrane, a proposal has been recently made for the use of an amorphous fluorocarbon polymer (see, for example, Japanese Pat. Kokai No. 3-67262).

The procedure usually undertaken for the preparation of these frame-supported pellicles is as follows. Thus, the above mentioned polymeric resin as the material of the pellicle membrane is dissolved in a suitable organic solvent in a concentration of 3 to 10% by weight and this solution is uniformly spread on a horizontally laid, flat surface of a substrate plate such as a semiconductor silicon wafer, glass plate and the like by using a suitable coating machine such as spin coater, knife coater and the like followed by evaporation of the solvent from the coating layer of the solution on the substrate surface to form a thin dried film of the polymeric resin to serve as the pellicle membrane. Thereafter, a rigid frame made from aluminum, stainless steel and the like is bonded to the resin film still on the substrate surface by using an adhesive followed by separation and removal of the substrate plate from the resin film so as to complete a frame-supported pellicle.

The above mentioned step of separation of the substrate plate from the resin film adhesively bonded to the pellicle frame can of course be performed in an ordinary atmosphere of a clean room provided that the resin film is not firmly bonded by virtue of an appropriate surface-release treatment of the substrate surface. An improvement relative to this separating work of the resin film and the substrate plate has been recently proposed in Japanese Patent Kokai No. 3-67262, according to which the separating work is conducted in water. This method is not free from a problem of dust particle deposition because, in addition to the particles floating in the water bath, any particles formed from the holders of the substrate plate and the pellicle frame in contact with water are released into the water bath and the floating dust particles in water are eventually deposited on the pellicle membrane as well as on the pellicle frame to cause troubles after drying of the pellicle freed from the substrate plate.

SUMMARY OF THE INVENTION

The present invention accordingly has an object to provide a novel and improved method for the preparation of a frame-supported pellicle free from the above described problems relative to dust particle deposition.

Thus, the method of the present invention for the preparation of a frame-supported pellicle, which consists of a rigid frame and a thin transparent film of a polymeric resin adhesively bonded to a surface of the frame in a slack-free fashion, comprises the steps of:

(a) uniformly spreading a solution of the polymeric resin over the surface of a horizontally laid, flat substrate plate to form a layer of the solution;

(b) evaporating the solvent from the layer of the solution on the substrate plate to form a dried film of the polymeric resin;

(c) adhesively bonding the film of the polymeric resin on the substrate surface to a surface of the frame; and (d) separating and removing the substrate from the film of the polymeric resin adhesively bonded to the frame, the step (d) being conducted in a gaseous atmosphere of which the relative humidity of the atmosphere is at least 80% and the temperature is not lower than the dew point of the gaseous atmosphere.

Though dependent on the cleanness of the atmosphere in which the work of the above mentioned step (d) is conducted, it is possible according to the inventive method described above to obtain a frame-supported pellicle of which the number of the deposited dust particles having a particle diameter of 1 to 20 μm does not exceed 30 per 100 cm² when the cleanness of the atmosphere is kept sufficiently high.

DETAILED DESCRIPTION OF THE PREFERRED EMBODIMENTS

As is described above, the most characteristic feature of the inventive method consists in the step (d) which is conducted in a specific gaseous atmosphere defined in terms of the relative humidity. This method is advantageous because the number of the dust particles deposited on the pellicle membrane can be kept very small when the relative humidity of the atmosphere is 80% or higher and, in addition, the drying treatment, which is indispensable when separation of the substrate plate from the resin film is conducted in water, can be entirely omitted.

The above obtained improvement relative to the step (d) is quite unexpected from the prior art methods in which the step is conducted either in water or in a gaseous atmosphere of a clean room which is always air-conditioned to have a relative humidity never exceeding 60%.

The above defined inventive method is applicable to any polymeric resins as the material of the pellicle membrane. In step (a) of the inventive method, a solution of the polymeric resin in a suitable organic solvent prepared in a concentration of 3 to 10% by weight is uniformly spread over the surface of a horizontally laid, flat substrate plate by using a suitable coating machine such as a spin coater, knife coater and the like. The substrate plate is not limitative relative to the material including semiconductor silicon wafers, glass plates and plates of a ceramic material such as alumina, silicon nitride and the like. The volume of the resin solution to be spread over the substrate surface should be sufficient to give a resin film after drying having a thickness in the range from 0.3 to 8 μm in consideration of the balance between the mechanical strengths and transmission of light therethrough in the patternwise exposure. The optimum thickness of the pellicle membrane to give the highest light transmission depends also on the refractive index of the polymeric resin forming the film and the wavelength of the light according to the equation:

$$d = m(\lambda/2n),$$

in which d is the thickness of the membrane μm to give a maximum value of light transmission, λ is the wavelength of the light in μm, n is the refractive index of the polymeric resin forming the membrane and m is an integer. It is preferable that the surface of the substrate is subjected beforehand to a surface-release treatment in order to facilitate separation thereof from the resin film formed thereon.

In step (b) of the inventive method, the layer of the resin solution spread over the substrate surface is dried by evaporating the solvent as completely as possible. In step (c) of the inventive method, a rigid pellicle frame made from a material such as aluminum, stainless steel, polyethylene and the like is adhesively bonded to the resin film formed on and still supported by the substrate plate by using an adhesive which is not particularly limitative including heat-curable ones and hot-melt type ones depending on the polymeric resin of the film and the material of the pellicle frame. Needless to say, the steps of (a) to (c) are performed in a clean room freed from dust particles floating in the atmosphere as completely as possible.

In step (d) of the inventive method, the substrate plate, on which the resin film is formed, is separated and removed from the resin film adhesively bonded to the pellicle frame. This step can be performed by merely pulling the substrate and the pellicle frame apart in a clean room, desirably, having such a cleanness that the number of dust particles having a particle diameter of 0.5 to 1μm floating in 1 cubic foot of the air does not exceed 10 in the substantial absence of any larger dust particles. When this cleanness of the gaseous atmosphere is ensured, it is possible by the inventive method to obtain a frame-supported pellicle of which the number of dust particles having a particle diameter of 1 to 20 μm deposited on the pellicle membrane does not exceed 10 per 100 cm² of the membrane with absolute absence of any larger particles. The gas forming the atmosphere, in which the step (d) of the inventive method is conducted, is not limited to air but can be any other gases such as nitrogen, oxygen, argon and the like provided that the gas is inert to the materials of the pellicle membrane, frame, adhesive and substrate plate although no particular advantages can be obtained by using a gas other than air. The pressure of the atmosphere is also not limitative which can be under a reduced pressure or under pressurization although no particular advantages can be obtained by decreasing or increasing the pressure so that it is the most convenient way that the step (d) is conducted in an atmosphere of air under normal pressure.

It is essential that the gaseous atmosphere, in which the step (d) of the inventive method is undertaken, is controlled to have a relative humidity of at least 60% or, preferably, at least 80%. The upper limit of the relative humidity is preferably 99% because an excessively high relative humidity means that the temperature of the atmosphere approaches the dew point eventually to cause a trouble due to dewing resulting in an increase in the dust deposition or necessity of subsequent drying although the releasability of the resin film from the substrate surface is improved by increasing the relative humidity. In other words, the temperature of the atmosphere should be higher than the dew point for the relative humidity. No particular advantages can be obtained by conducting step (d) at a temperature higher or lower than room temperature so that the temperature can be that of an ordinary air-conditioned clean room. When the relative humidity of the atmosphere is too low, the releasability of the resin film from the substrate surface is decreased so that the resin film under separation from the substrate is under stretching not to give the pellicle membrane in a slack-free fashion or eventually to cause rupture of the resin film.

In conducting the method of the present invention, it is preferable to select the polymeric resin as the material of the pellicle membrane from those having a high permeability to moisture when the resin is shaped in the form of a film since the water molecules permeating the resin film and reaching the substrate surface may exhibit a releasing effect similar to that obtained when the step is conducted in water.

In the following, the method of the invention is illustrated in more detail by way of Examples and Comparative Examples.

EXAMPLES AND COMPARATIVE EXAMPLES

A commercially available fluorocarbon-containing polymer (Sitop Type CTXS, a product by Asahi Glass Co.), which is a copolymer consisting of a tetrafluoroethylene moiety and a cyclic perfluoro ether moiety in a molar ratio of 0.52:1.0, was dissolved in a fluorocarbon-containing solvent (CT solv 180, a product by the same company, supra) to give a solution in a concentration of 6.0% by weight. This solution was uniformly spread by using a spin coater over the surface of a fused quartz glass disc having a diameter of 200 mm and a thickness of 3 mm to form a layer which was dried by heating at 180° C. for 15 minutes to give a dried resin film having a thickness of 0.84 μm on the substrate surface.

Separately, a surface-anodized square aluminum frame having dimensions of 120 mm a side (outer), 116 mm a side (inner) and thickness of 6 mm was coated on one surface with an adhesive, which was a fluorocarbon-containing diorganopolysiloxane-based composition, and the above prepared resin film on the substrate surface was mounted on the thus adhesive-coated surface of the frame to effect adhesive bonding therebetween.

The above prepared assembly of the pellicle frame and the resin film on the substrate plate adhesively bonded to the frame by means of an adhesive was put into a chamber of which the atmosphere was controlled to have a varied relative humidity at a specified temperature, and the substrate and the pellicle frame were pulled apart so as to give a flame-supported pellicle.

When the relative humidity of the atmosphere was 84%, 88% or 99% at a temperature of 19.7° C., 20.2° C. or 21.6° C., respectively, the resulting pellicle membrane was in a quite sound condition without slack. When the relative humidity was 50% or 59% at a temperature of 23.1° C. or 25.3° C., respectively, rupture was found in the pellicle membrane obtained under 50% relative humidity and the pellicle membrane obtained under 59% relative humidity was noticeably slacked to exhibit creases.

What is claimed is:

1. A method for the preparation of a frame-supported pellicle consisting of a rigid frame and a thin transparent film of a polymeric resin adhesively bonded to a surface of the frame in a slackfree fashion, which comprises the steps of:
    (a) uniformly spreading a solution of the polymeric resin over the surface of a horizontally laid, flat substrate plate to form a layer of the solution;
    (b) evaporating the solvent from the layer of the solution on the substrate plate to form a dried film of the polymeric resin;
    (c) adhesively bonding the film of the polymeric resin on the substrate surface to a surface of the frame; and
    (d) separating and removing the substrate from the film of the polymeric resin adhesively bonded to the frame, the step (d) being conducted in a gaseous atmosphere of which the relative humidity of the atmosphere is at least 80% and the temperature is not lower than the dew point of the gaseous atmosphere.

2. The method for the preparation of a frame-supported pellicle as claimed in claim 1 in which the gas forming the atmosphere in which step (d) in conducted is air under normal pressure.

3. The method of claim 1 which is carried out in a clean room having a cleanness such that the number of dust particles having a particle diameter of 0.5 to 1 μm per cubic foot of air, does not exceed 10 and with the substantial absence of larger dust particles.

4. The method of claim 3 wherein the number of dust particles having a particle diameter of 1 to 20 μm deposited on the pellicle membrane does not exceed 10 per 100 cm² of the membrane and no larger particles are present.

* * * * *